United States Patent [19]
Sedlak

[11] Patent Number: 6,044,021
[45] Date of Patent: Mar. 28, 2000

[54] PROGRAMMABLE READ-ONLY MEMORY WITH IMPROVED ACCESS TIME

[75] Inventor: Holger Sedlak, Egmating, Germany

[73] Assignee: Siemens Aktiengesellschaft, Munich, Germany

[21] Appl. No.: 09/171,481

[22] PCT Filed: Apr. 16, 1997

[86] PCT No.: PCT/DE97/00763

§ 371 Date: Oct. 19, 1998

§ 102(e) Date: Oct. 19, 1998

[87] PCT Pub. No.: WO97/40501

PCT Pub. Date: Oct. 30, 1997

[30]     Foreign Application Priority Data

Apr. 18, 1996 [DE] Germany ............................ 196 15 407

[51] Int. Cl.[7] .................................................. G11C 16/04
[52] U.S. Cl. .............................. 365/185.26; 365/185.14; 365/239
[58] Field of Search ........................ 365/185.26, 185.14, 365/104, 185.29, 185.33, 239

[56]                References Cited

U.S. PATENT DOCUMENTS

| | | | |
|---|---|---|---|
| 4,612,630 | 9/1986 | Rosier | 365/201 |
| 5,132,928 | 7/1992 | Hayashikoshi et al. | 365/63 |
| 5,218,568 | 6/1993 | Lin et al. | 365/185 |
| 5,537,349 | 7/1996 | Devin | 365/185.33 |

FOREIGN PATENT DOCUMENTS 0 589 266 A1  3/1994  European Pat. Off. .

*Primary Examiner*—David Nelms
*Assistant Examiner*—Thong Le
*Attorney, Agent, or Firm*—Hill & Simpson

[57]                ABSTRACT

Programmable read-only memory of the EEPROM type, whose memory cells are formed by a memory transistor (ST), which has an insulated gate electrode (FG), and a selection transistor (AT), which is connected in series with the said memory transistor, the drain terminal of a respective selection transistor (AT) being connected to a bit line (BL) and the gate terminal of a respective selection transistor (AT) being connected to a word line (WL), and it being possible to apply a read voltage ($U_L'$) to the control gate terminal (SG) of the memory transistors (ST), the value of the read voltage ($U_L'$) depending on the frequency ($f_{cl}$) of the reading clock signal (clock1; clock2).

4 Claims, 2 Drawing Sheets

FREQUENCY TO VOLTAGE CONVERTER

PROGRAMMABLE READ-ONLY MEMORY WITH IMPROVED ACCESS TIME

BACKGROUND OF THE INVENTION

1. Field of the Invention

The present invention relates generally to a read-only memory and specifically to an EEPROM type programmable read only memory having a variable read voltage.

2. Description of the Related Art

In the case of programmable read-only memories of the EEPROM type, a memory cell is constructed using two MOS transistors and arranged at the crossover point between a word line WL and a bit line BL. This is illustrated in FIG. 3. One of the transistors ST has an insulated gate electrode FG, the charge state of which can be used to set the threshold voltage of this transistor. This transistor ST is the actual memory transistor. In the case of an erased memory cell having n-channel transistors, the insulated gate electrode is negatively charged, with the result that the threshold voltage of the memory transistor ST is shifted towards higher values. In the case of a programmed memory cell, the insulated gate electrode is discharged or even positively charged. The threshold voltage then corresponds to that of a customary MOS transistor or is lower. For the purpose of reading, a read voltage $U_L$, which lies approximately between the threshold voltages of a programmed and an erased memory transistor, is applied to the control gate electrode SG of the memory transistor ST. If the transistor is erased, it is in the off state; if it is programmed, it will turn on. In the case of p-channel transistors, the conditions are exactly the opposite.

A selection transistor AT, whose drain electrode is connected to a bit line BL and whose gate electrode is connected to a word line WL, is connected in series with this memory transistor ST. By applying a voltage corresponding approximately to the supply voltage $V_{DD}$ to the word line WL or the gate of the selection transistor AT, the latter is turned on and connects the drain terminal of the memory transistor ST to the bit line BL. The latter is charged to approximately the supply voltage potential $V_{DD}$ prior to a reading operation. If the cell is erased, the memory transistor ST is in the off state and the bit line BL remains at the supply voltage potential $V_{DD}$. A logic "1" is read out. If the cell is programmed, the memory transistor ST is in the on state and the bit line BL is discharged via it, with the result that a logic "0" can be detected after a certain amount of time. These facts are illustrated in the upper part of FIG. 4. At an instant t0, the bit line BL is charged to a voltage $U_{BL}$ having a value of approximately $V_{DD}$. At the instant t1, the voltage $U_{WL}$ on the word line WL is switched to a value of approximately $V_{DD}$ by, for example, the falling edge of a clock signal clock1. In the case of an erased cell, which is represented by a I, the voltage $U_{BL}$ of the bit line remains at the value $V_{DD}$, whereas in the case of a programmed cell, which is represented by a II, the voltage $U_{BL}$ of the bit line decreases.

If the frequency of the clock signal clock1 is small enough, an evaluation operation can be triggered at the instant t2 by the next falling edge. At this instant, the bit line BL has already been discharged to an extent which is sufficient to be able unambiguously to detect a programmed state.

If, however, it is intended to reduce the access time, the clock frequency must be increased. A doubled clock frequency clock2 is illustrated as an example in FIG. 4. In that case, following connection of the supply voltage $V_{DD}$ to the word line WL at the instant t1, evaluation would take place after a period at the instant t3. At this instant, however, the bit line BL has not yet been completely discharged in the case of a programmed cell, with the result that there is the risk of incorrect detection.

SUMMARY OF THE INVENTION

An object of the present invention, therefore, is to provide a programmable read-only memory of the EEPROM or flash type in which unambiguous reading is possible for any desired access time.

This and other objects are achieved by means of a read-only memory of the EEPROM type, whose memory cells are formed by a memory transistor, which has an insulated gate electrode, and a selection transistor, which is connected in series with the memory transistor, the drain terminal of a respective selection transistor being connected to a bit line and the gate terminal of a respective selection transistor being connected to a word line, and it being possible to apply a read voltage to the control gate terminal of the memory transistors, wherein the value of the read voltage depends on the frequency of the reading clock signal. Advantageous developments are derived when the read voltage increases at least from a specific, critical reading clock signal frequency. Preferably, the increase in the read voltage proceeds linearly.

In one embodiment, the gate terminal of the memory transistor is driven by the output signal of a frequency-to-voltage converter to which the reading clock signal is applied.

The programmable read-only memory according to the invention permits application-dependent selection of the frequency of the clock signal without having to consider circuit-dictated restrictions regarding the read access times to the memory.

BRIEF DESCRIPTION OF THE DRAWINGS

The invention is explained in more detail below using an exemplary embodiment.

DETAILED DESCRIPTION OF THE PREFERRED EMBODIMENTS

Figure 1:
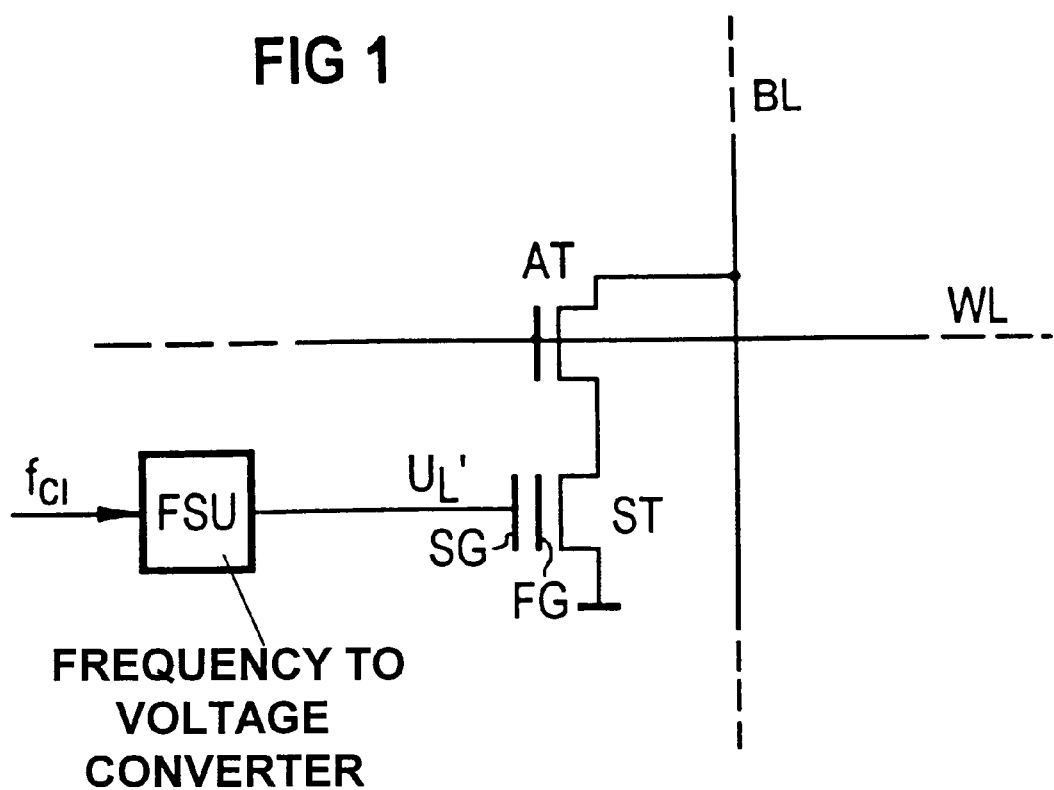
FIG. 1 is a circuit diagram which shows an EEPROM memory cell having circuitry according to the invention.

In order to illustrate the invention, FIG. 1 illustrates just one memory cell of a programmable memory of the EEPROM type. The entire memory is formed by a multiplicity of such memory cells, which are arranged in matrix form along a grid of word lines WL and bit lines BL and can be addressed by means of circuits which are familiar to a person skilled in the art and are not illustrated.

The invention can be applied in the same way to flash memories.

In order to read the contents of the memory cells, the respectively addressed bit line BL is charged to the supply voltage potential $V_{DD}$ and then the supply voltage potential $V_{DD}$ is likewise connected to the corresponding word line WL, as a result of which the selection transistor AT of the addressed memory cell is turned on. In all of the memory cells of the EEPROM, a read voltage $U_L'$ is always present at the control gate terminal SG of the memory transistors ST. In the manner according to the invention, this read voltage $U_L'$, depends on the frequency $f_{cl}$, of the clock signal which is used to trigger the sequential events during reading from the memory.

Figure 2:
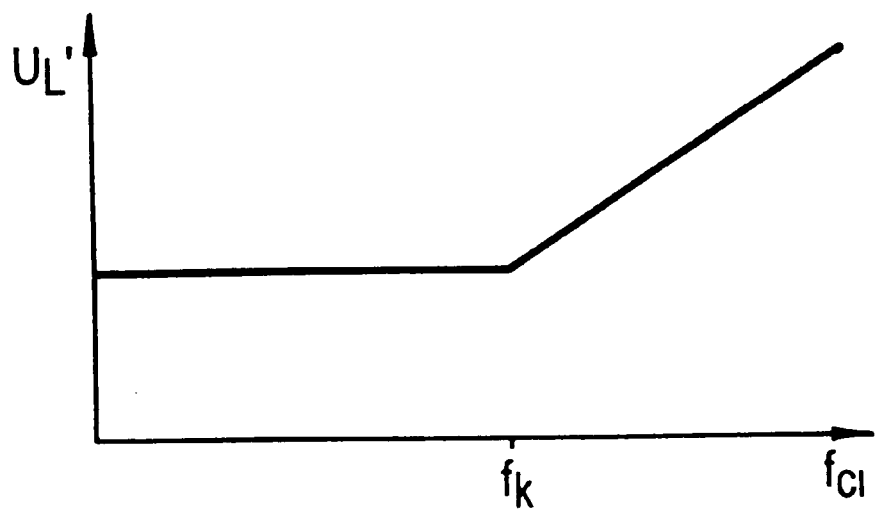
FIG. 2 is a graph which shows a possible profile of the $U_L'$-$f_{cl}$ characteristic curve.
Figure 3:
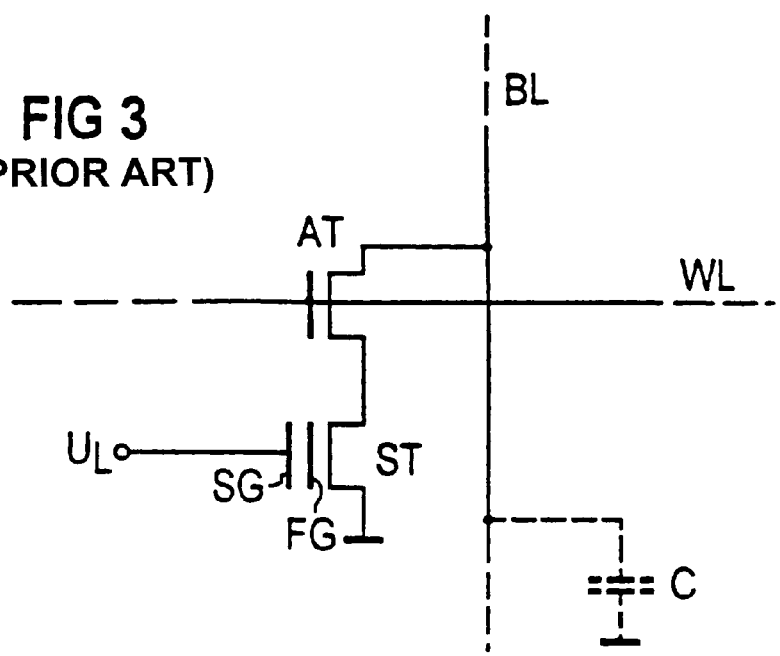
FIG. 3 is a circuit diagram which shows an EEPROM memory cell according to the prior art.

FIG. 2 shows a possible profile of the read voltage $U_L'$ as a function of the clock signal frequency $f_{cl}$. The read voltage $U_L'$ remains constant up to a specific critical frequency $f_k$, then it rises linearly. However, other profiles are also conceivable; what is essential is that the gradient of the curve is greater than or equal to 0.

The profile of the read voltage $U_L'$ depends on the transfer properties of a frequency-to-voltage converter FSU, at whose output the read voltage $U_L'$ is provided. The output signal of this frequency-to-voltage converter FSU is applied to the control gate terminals SG of the memory transistors ST of an EEPROM according to the invention.

By increasing the read voltage $U_L'$, the memory transistor ST becomes more conductive, with the result that the addressed bit line BL becomes discharged more rapidly. This is illustrated in the lower part of FIG. 4. II represents the profile of the voltage $U_{BL}'$ on the addressed bit line BL in the case of a programmed memory cell. In this case, unambiguous detection of the programmed state is possible even at a higher frequency of the clock signal clock2.

Figure 4:
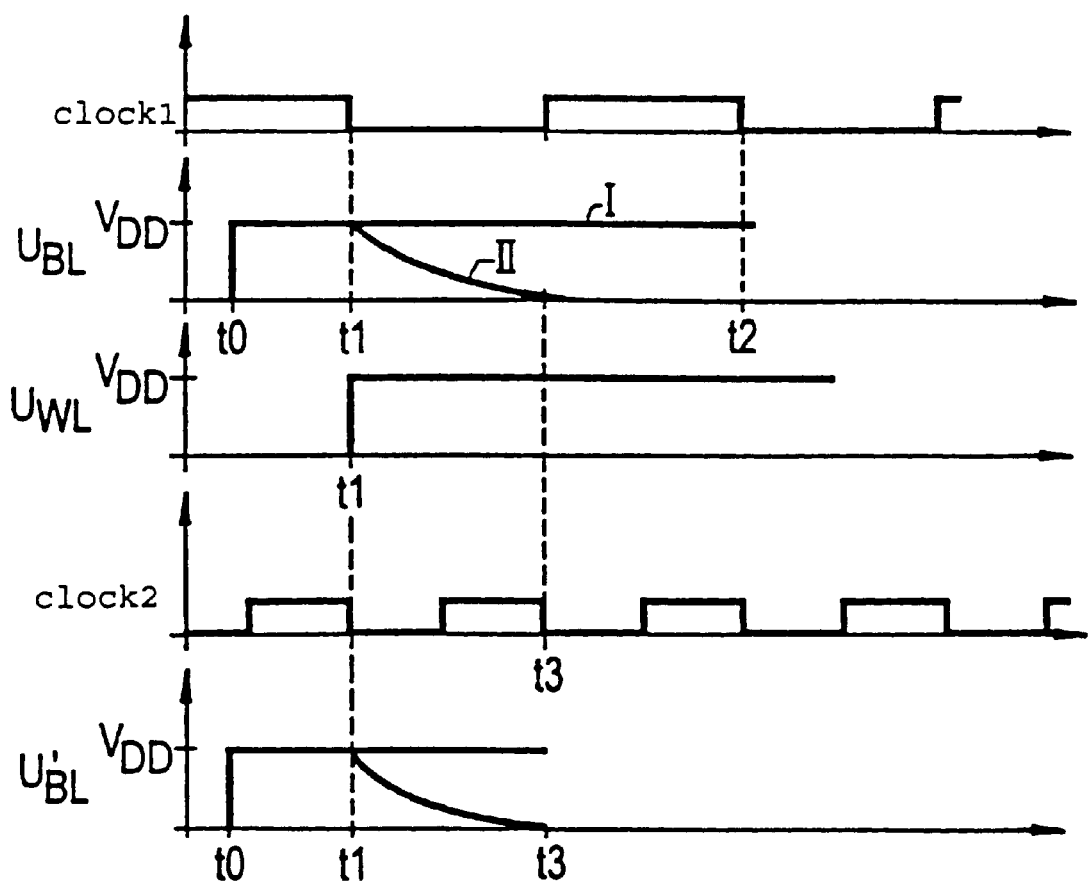
FIG. 4 is a collection of graphs which shows the time profile of a number of voltages during the reading of a cell.

It is possible that the addressed bit line BL is also discharged somewhat in the case of an erased cell, on account of the higher conductivity of the memory transistor ST, which is indicated in the lower part of FIG. 4 by a profile, identified by I, of the voltage $U_{BL}'$ on the bit line BL. However, this discharge will always be so low that no disadvantages result from it.

Although other modifications and changes may be suggested by those skilled in the art, it is the intention of the inventors to embody within the patent warranted hereon all changes and modifications as reasonably and properly come within the scope of their contribution to the art.

What is claimed is:

1. A programmable read-only memory of an EEPROM type, comprising:

a word line and a bit line;

a memory cell having:

memory transistor, which has an insulated gate electrode;

a selection transistor connected in series with said memory transistor, a drain terminal of said selection transistor being connected to said bit line and a gate terminal of said selection transistor being connected to said word line, and a read voltage being connected to a control gate terminal of said memory transistor; and a frequency-voltage control connected so that a value of the read voltage depends on a frequency of a reading clock signal.

2. A programmable read-only memory according to claim 1, wherein said frequency-voltage control includes a predetermined frequency above which the read voltage increases.

3. A programmable read-only memory according to claim 2, wherein said frequency-voltage control increases the read voltage linearly.

4. A programmable read-only memory according to claim 1, wherein said frequency-voltage control is a frequency-to-voltage converter having an output connected to the control gate terminal of the memory transistor which is driven by an output signal of said frequency-to-voltage converter to which the reading clock signal is applied.

* * * * *